United States Patent
Katoh et al.

[11] Patent Number: 6,054,904
[45] Date of Patent: Apr. 25, 2000

[54] VOLTAGE CONTROLLED RING OSCILLATOR AND CHARGE PUMP CIRCUIT

[75] Inventors: Hisao Katoh; Takeyasu Nakai, both of Tokyo, Japan

[73] Assignees: Mitsubishi Denki Kabushiki Kaisha; Mitsubishi Electric Engineering Company Limited, both of Tokyo, Japan

[21] Appl. No.: 09/154,753

[22] Filed: Sep. 17, 1998

[30] Foreign Application Priority Data

May 18, 1998 [JP] Japan ................... 10-135742

[51] Int. Cl.[7] .............. H03B 5/02; H03L 7/085; H03L 7/099
[52] U.S. Cl. .................. 331/27; 331/34; 331/57
[58] Field of Search .................. 331/25, 27, 34, 331/57

[56] References Cited

U.S. PATENT DOCUMENTS 5,621,360  4/1997  Huang ........................ 331/57

FOREIGN PATENT DOCUMENTS 263219  3/1990  Japan.
9266443  10/1997  Japan.

*Primary Examiner*—Siegfried H. Grimm
*Attorney, Agent, or Firm*—Leydig, Voit & Mayer, Ltd.

[57] ABSTRACT

A voltage controlled ring oscillator has a current control circuit and an odd number of inverter circuits. Each inverter circuit has a current charge preventing circuit connected between a ground voltage and a connection node located between a current source transistor and a complementary transistor circuit and a current discharge preventing circuit connected between a high voltage power source and a connection node located between a current source transistor and a complementary transistor circuit.

6 Claims, 5 Drawing Sheets

VP1 : POWER SOURCE
VN1 : POWER SOURCE

VP2 : POWER SOURCE
VN2 : POWER SOURCE

VOLTAGE CONTROLLED RING OSCILLATOR AND CHARGE PUMP CIRCUIT

BACKGROUND OF THE INVENTION

1. Field of the Invention

The present invention relates to a voltage controlled oscillator (VCO) of a ring type and a charge pump circuit, each integrated in a semiconductor chip, oscillating and outputting a stable high frequency.

2. Description of the Prior Art

Conventionally, voltage controlled oscillators are incorporated into many devices and applied to a wide range of application fields such as a phase locked loop (PLL), communication field, computer field, image and audio device field, and the like. In recent years, there is a requirement in those fields to provide a voltage control oscillator oscillating and outputting a more stable and higher frequency for various types of devices and systems that may operate at a higher speed.

When a PLL and a controller to control the delay time of a signal are integrated on a semiconductor chip, ring oscillators are used as voltage controlled oscillators (VCO). Ring oscillators control the magnitude of a current flowing through an odd number of inverter circuits that are electrically connected in a ring. Although this demand may be achieved by using a fine technique in semiconductor fabrication processes, this decreases stable oscillation due to parasitic capacitances in a semiconductor integrated circuit designed to output a higher frequency.

FIG. 1 is a circuit diagram showing a conventional voltage controlled ring oscillator. In FIG. 1, the reference numbers 61, 62, 63, 64, . . . , and n (n is an odd number) designate inverter circuits that are connected electrically in an odd number of stages in a ring, and the reference number 65 denotes a current control circuit. This conventional voltage controlled oscillator shown in FIG. 1 comprises the current control circuit 65 andthe inverter circuits 61, 62, 63, 64, . . . , n in the odd number of stages. Each of the inverter circuits 61, 62, 63, 64, . . . , n comprises current source transistors P1 and N1 whose operation is controlled by a voltage, switching transistors P2 (P channel type transistor) and N2 (N channel type transistor) for switching a current supplied from each of the current source transistors P1 and N1. Those transistors P1, P2, N1, and N2 are electrically connected in series. As shown in FIG. 1, the inverter circuits 62, 63, 64, . . . , and n are connected in a ring shape in order to form complementary circuits.

Next, a description will be given of the operation of the conventional voltage controlled ring oscillator shown in FIG. 1.

Here, the operation of the inverter circuit as only one stage in the conventional voltage controlled ring oscillator will be explained for brevity.

The operation of the current source transistor P1 is controlled by a magnitude of an output voltage from the current control circuit 65. The gate electrodes and the drain electrodes of both the P channel switching transistor P2 and the N channel switching transistor N2 are connected electrically to each other. The gate electrode and the drain electrode of each of the P channel switching transistors P2 and the N channel switching transistors N2 in the inverter circuits in the odd number of stages are electrically connected to each other to form the ring shape, as shown in FIG. 1.

In the same manner as the current source transistor P1, the operation of the current source transistor N1 is also controlled by the output voltage supplied from the current control circuit 65. In addition, like the P channel switching transistor P2, the gate electrode and the drain electrode of the N channel switching transistor N2 in the inverter stage in one stage are electrically connected to the gate electrode and the drain electrode of the inverter circuit in another stage, respectively, in the ring shape.

In general, in voltage controlled oscillators such as the conventional voltage controller having the configuration shown in FIG. 1, current output from each of the current source transistors P1 and N1 is controlled by the output voltage from the current control circuit 65 in order to change a the delay caused in the inverter circuits connected in a ring. This controls an oscillating frequency of the voltage controlled oscillator. In this case, parasitic capacitances CDP and CDN in the drain capacitor and a parasitic capacitor CG in a drain-gate capacitor includes a parasitic capacitor in a wiring capacitor. These parasitic capacitors CDP, CG, and CDN are charged and discharged to the voltage of the power source and to the ground voltage, respectively, while the current source transistors P1 and N1 are in OFF state. These charges move to the gate capacitor CG in the inverter circuit at the following stage through the output terminal of the current inverter circuit. The amount of the moving charges is determined based on the ratio of the parasitic capacitances CDP or CDN and CG. These moving charges act fail to maintain the linearity of the current control by the current control circuit 65, so that oscillation halts or a discontinuous change of the frequency is caused when the output voltage from the current source transistors P1 and N1 crosses the value of the threshold voltage of the inverter circuit at the following stage when the switching transistors P2 and N2 enter ON. This causes an unstable state of the system because the phase lock operation becomes unstable.

FIG. 2 is an explanation diagram showing a case in which the value of the output voltage from the current source transistors P1 and N1 in one inverter circuit becomes lower than that of an input threshold voltage of the following inverter circuit in the conventional voltage controlled oscillator shown in FIG. 1. In FIG. 2, the fine line designates the waveform of the output voltage from the current source transistors P1 and N1 in one inverter circuit in the voltage controlled oscillator as an ideal case where the values of the parasitic capacitors CDP and CDN are zero. In addition, the solid line denotes the waveform of the output voltage from the current source transistors P1 and N1 in one inverter circuit in the voltage controlled oscillator as an actual case where the values of the parasitic capacitors CDP and CDN are not zero.

As shown in FIG. 2, when the value of the output voltage from the current source transistors P1 and N1 in one inverter circuit crosses the threshold voltage of the inverter circuit at the following stage, the phase lock operation becomes unstable based on the ratio of the parasitic capacitances as CDP or CDN and CG, because the characteristic of the ring oscillation circuit becomes bad and the phase lock operation enters an unstable state. This causes a system including the conventional voltage controlled oscillator to enter an unstable state.

Because the conventional voltage controlled oscillator has the configuration described above, when the switching transistors enter the OFF state, the parasitic capacitances are charged or discharged, and these charges decrease the characteristic of the ring oscillation circuit, the phase lock operation becomes unstable and thereby the entire operation of the system also enters an unstable state.

SUMMARY OF THE INVENTION

Accordingly, an object of the present invention is, with due consideration to the drawbacks of the conventional technique, to provide a voltage controlled ring oscillator and a charge pump circuit preventing charging or discharging of parasitic capacitances while switching transistors are in an OFF state and maintaining stable oscillation stability.

In accordance with a preferred embodiment of the present invention, a voltage controlled oscillator comprises a plurality of inverter circuits in odd number of stages connected to each other in a ring form, and a current control circuit for generating and outputting a control voltage. Each of said plurality of inverter circus comprises a first current source transistor connected to a first power source, a second current source transistor connected to a second power source, a complementary transistor circuit connected between said first current source transistor and said second current source transistor, a first current discharge preventing circuit for preventing discharging of charges accumulated in a parasitic capacity, connected between said first current source and a connection node between said second current source transistor and said complementary transistor circuit, and a first current charge preventing circuit for preventing charging of charges accumulated in a parasitic capacity, connected between said second current source and a connection node between said first current source transistor and said complementary transistor circuit. The current control circuit outputs said control voltage to said first current source transistor and said second current source transistor in each of said plurality of inverter circuits.

In the voltage controlled oscillator as another preferred embodiment of the present invention, said complementary transistor circuit comprises a P channel switching transistor and a N channel switching transistor connected in series, and said first current discharge preventing circuit comprises a P channel current source transistor and a P channel switching transistor connected in series, and said first current charge preventing circuit comprises a N channel current source transistor and a N channel switching transistor connected in series.

In the voltage controlled oscillator as another preferred embodiment of the present invention, a third power source is incorporated instead of said P channel current source transistor in said first current discharge preventing circuit, and a fourth power source is incorporated instead of said N channel current source transistor in said first current charge preventing circuit, and wherein a voltage of each of said parasitic capacitances are controlled by said voltages of said third and fourth power sources in order top prevent the discharging and charging of charges accumulated in said parasitic capacities.

In accordance with a preferred embodiment of the present invention, a charge pump circuit comprises a third current source transistor connected to a first power source, a fourth current source transistor connected to a second power source, a complementary transistor circuit connected between said third current source transistor and said fourth current source transistor, a second current discharge preventing circuit for preventing discharging of charges accumulated in a parasitic capacity, connected between said first current source and a connection node between said fourth current source transistor and said complementary transistor circuit, and a second current charge preventing circuit for preventing charging of charges accumulated in a parasitic capacity, connected between said second current source and a connection node between said third current source transistor and said complementary transistor circuit.

In the charge pump circuit as another preferred embodiment of the present invention, said complementary transistor circuit comprises a P channel switching transistor and a N channel switching transistor, and said second current discharge preventing circuit comprises a P channel current source transistor and a P channel switching transistor, and said second current charge preventing circuit comprises a N channel current source transistor and a N channel switching transistor, and wherein a gate electrode of said P channel switching transistor in said complementary transistor circuit is connected to a gate electrode of said P channel switching transistor in said second current discharge preventing circuit, and a gate electrode of said N channel switching transistor in said complementary transistor circuit is connected to a gate electrode of said N channel switching transistor in said second current charge preventing circuit.

In the charge pump circuit as another preferred embodiment of the present invention, a fifth power source is incorporated instead of said P channel current source transistor in said second current discharge preventing circuit, and a sixth power source is incorporated instead of said N channel current source transistor in said second current charge preventing circuit, and wherein a voltage of each of said parasitic capacitances are controlled by said voltages of said fifth and sixth power sources in order top prevent the discharging and charging of charges accumulated in said parasitic capacities.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the voltage controlled oscillator and the charge pump circuit according to the present invention will now be described with reference to the drawings.

First Embodiment

Figure 5:
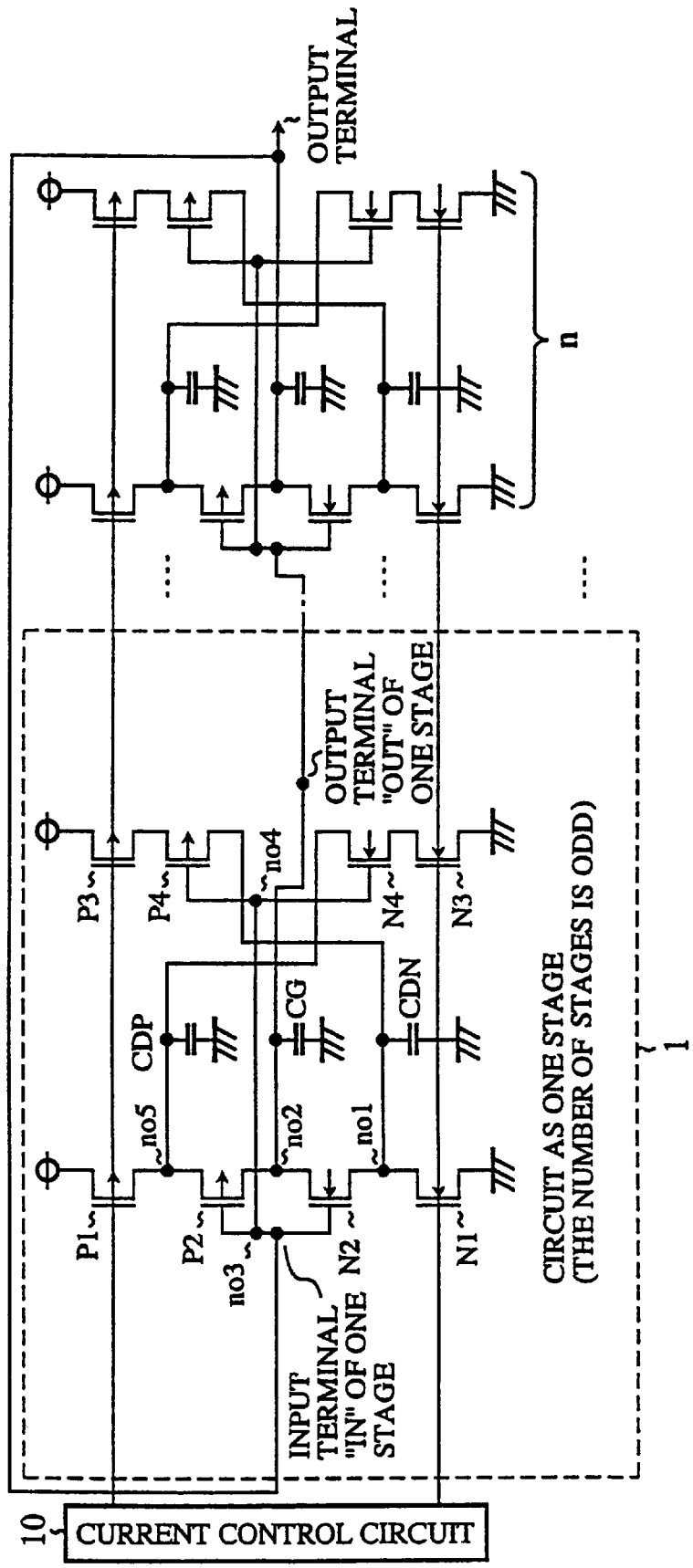
FIG. 5 is a circuit diagram showing a voltage controlled oscillator according to a first embodiment of the present invention.

FIG. 5 is a circuit diagram showing a voltage controlled oscillator according to the first embodiment of the present invention. In FIG. 5, the reference numbers 1, . . . , n (n is an odd number) designate inverter circuits connected in series in an odd number stages. The reference number 10 denotes a current control circuit. The voltage controlled ring oscillator of the first embodiment comprises the current control circuit and the inverter circuits in an odd number stages. Those inverter circuits 1, . . . , n are connected in series through each input terminal IN and each output terminal OUT. Those inverter circuits 1, . . . , n the odd number of stages.

Each of the inverter circuits 1, . . . , n comprises current source transistors P1 and N1 (a first current source transistor P1 and a second current source transistor N1) and switching transistors such as a P channel switching transistor P2 and a N channel switching transistor N2 (as a complementary transistor circuit) connected in series through a node no3. The current source transistors P1 and N1 are connected to the current sources (a first current source and a second current source), respectively, whose operations are controlled by an output voltage from the current control circuit 10. The switching transistors P2 and N2 switch currents flowing from the current source transistors P1 and N1, respectively. The current source transistor P1 is connected in series to the P channel switching transistor P2 through a node no5. Similarly, the current source transistor N1 is connected in series to the N channel switching transistor N2 through a node no1.

The reference number P3 designates a current source transistor (a first current discharge preventing circuit) and P4 denotes a P channel switching transistor (a first current discharge preventing circuit). Both the current source transistor P3 and the P channel switching transistor P4 are connected in series between the high voltage power source and the current source transistor N1.

The reference number N3 designates a current source transistor (a first current charge preventing circuit) and N4 denotes a N channel switching transistor (a first current charge preventing circuit). Both the current source transistor N3 and the N channel switching transistor N4 are connected in series between the ground voltage power source and the current source transistor P1.

The gate electrode of the P channel switching transistor P4 is connected to the gate electrode of the N channel switching transistor N4 through the node no4. This node no4 is connected to the node no3. The parasitic capacitances CDP and CDN of the drain capacitance of the transistor and the parasitic capacitance of the drain gate includes wiring capacitance between the current source transistor P1 and the P channel switching transistor P2 and between the current source transistor N1 and the N channel switching transistor N2, respectively.

Next, a description will be given of the operation of the voltage controlled oscillator of the first embodiment.

Both the current source transistor P3 and the P channel switching transistor P4 form the first current discharge preventing circuit for preventing discharge of the parasitic capacitance CDN into the ground voltage potential while the N channel switching transistor N2 is in OFF. In addition, the current source transistor N3 and the N channel switching transistor N4 form the first current charge preventing circuit for preventing to charging of the parasitic capacitance CDP by the voltage potential of the power source while the P channel switching transistor P2 is OFF. Both the current path formed by the current source transistor P3 and the P channel switching transistor P4 and the current path formed by the current source transistor N3 and the N channel switching transistor N4 become active, namely may operate in order to prevent discharging and charging of the parasitic capacitances CDP and CDN while the N channel switching transistor N2 is in OFF and the P channel switching transistor P2 is in OFF, respectively. It is thereby possible to improve the linearity of the oscillation frequency to the control voltage in the voltage controlled oscillator of the first embodiment and it is also possible to maintain stable oscillation of the voltage controlled oscillator.

Figure 6:
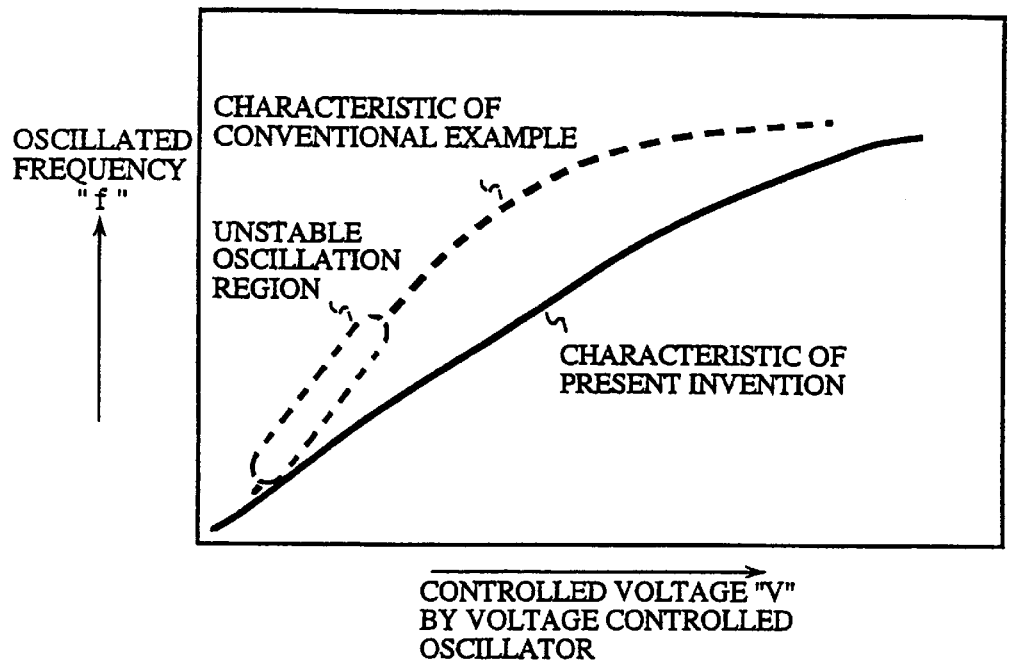
FIG. 6 is a diagram showing a comparison of the operation of a voltage controlled oscillator according to the present invention and the conventional voltage controlled oscillator.

FIG. 6 is a diagram showing a comparison of the operation of the voltage controlled oscillator according to the present invention and the conventional voltage controlled oscillator. That is, FIG. 6 shows the change of the frequency, as the output of the voltage controlled oscillator, relative to the output voltage as the control voltage output from the current control circuit 10 in the voltage controlled oscillator. In FIG. 6, the solid line denotes the oscillated frequency output from the voltage controlled oscillator of the first embodiment and the dotted line indicates the oscillated frequency output from the conventional voltage controlled oscillator.

As shown by the solid line in FIG. 6, it is clear that the voltage controlled oscillator of the first embodiment improves the linearity of the output frequency, even if the oscillated frequency is low, when comparing with the conventional voltage controlled oscillator that has an unstable oscillation.

As described above, according to the voltage controlled oscillator of the first embodiment, the first current discharge preventing circuit comprising the current source transistor P3 and the P channel switching transistor P4 prevents discharge of the parasitic capacitance CDN to the ground voltage potential while the N channel switching transistor N2 is OFF. In addition, the first current charge preventing circuit comprising the current transistor N3 and the N channel switching transistor N4 prevents charging of the parasitic capacity CDP to the voltage potential of the power source while the P channel switching transistor P2 is OFF. That is, it is possible to prevent discharging of the parasitic capacitance CDN and charging of the parasitic capacitance CDP, respectively, because the current path formed by the current source transistors P3 and the P channel switching transistor P4 and the current path formed by the current source transistors N3 and the N channel switching transistor N4 become ON, namely active, while the N channel switching transistor N2 and the P channel switching transistor P2 are OFF. As a result, it is possible to improve the linearity of the oscillated frequency relative to the control voltage in the voltage controlled oscillator, and to maintain stable oscillation.

Second Embodiment

Figure 7:
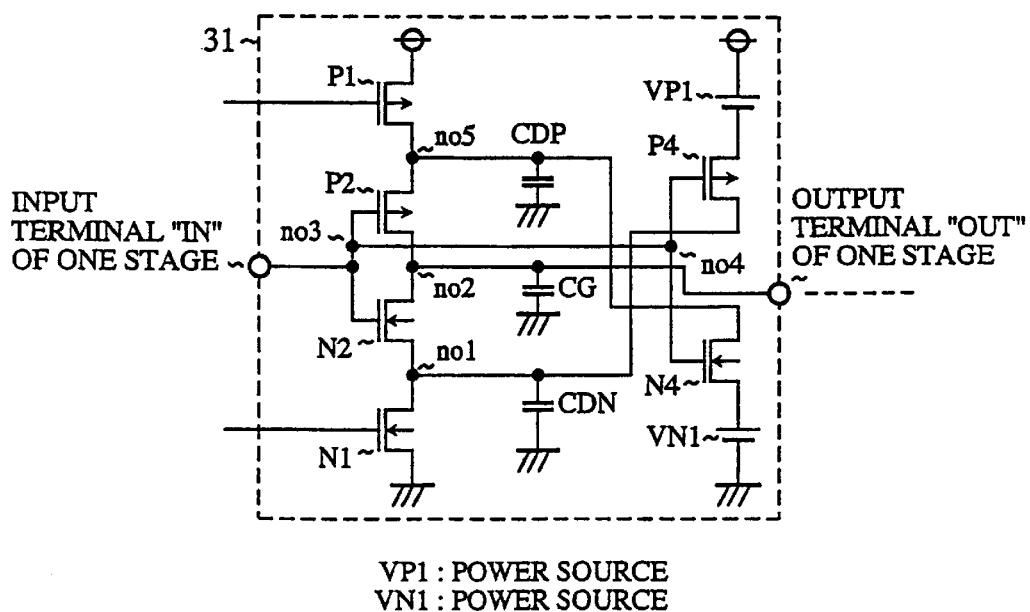
FIG. 7 is a circuit diagram showing a voltage controlled oscillator according to a second embodiment of the present invention.

FIG. 7 is a circuit diagram showing a voltage controlled oscillator according to the second embodiment of the present invention. In FIG. 7, the reference number 31 designates an inverter circuit as one stage of an odd number of stages in the voltage controlled oscillator of the second embodiment. Thus, the voltage controlled oscillator of the second embodiment has an odd number of inverter circuits like the voltage controlled oscillator of the first embodiment.

The operation of the inverter circuit 31 in each stage is controlled by the output voltage from the current control circuit 10 (omitted from FIG. 7). Each inverter circuit 31 comprises the current source transistors P1 and N1 connected to the current sources, the switching transistors for switching current flows from the current source transistors P1 and N1, namely the P channel switching transistor P2 and the N channel switching transistor N2 (as a complementary transistor circuit) connected in series through the node no3. Specifically, the current source transistor P1 is connected in series to the P channel switching transistor P2 through the node no5 and the current source transistor N1 is connected in series to the N channel switching transistor N2 through the node no1. In FIG. 7, the reference character VP1 is a power source (a third power source) and P4 denotes a P channel switching transistor.

The power source VP1 and the P channel switching transistor P4 is connected to the current source transistor N1 in series. The reference character VN1 denotes a power source (as a fourth power source), N4 designates a N channel switching transistor. This power source VN1 and the N channel switching transistor N4 is connected in series to the current source transistor P1. The gate electrode of the P channel transistor P4 is connected to the gate electrode of the N channel switching transistor N4 through the node no4. The node no4 is also connected to the node no3. Other components of the voltage controlled oscillator of the second embodiment are the same as those of the voltage controlled oscillator of the first embodiment, therefore, the same reference numbers are used for those components, and the explanation of the same components is omitted here for brevity.

In the voltage controlled oscillator of the second embodiment, each inverter circuit 31 is connected in a ring through its input terminal IN and its output terminal OUT, respectively. Thus, the voltage controlled oscillator of the second embodiment comprises the odd number inverter circuits 31 and the current control circuit 10.

Next, a description will be given of the operation of the voltage controlled oscillator of the second embodiment.

Both the current source VP1 and the P channel switching transistor P4 form the first current discharge preventing circuit for preventing discharge of the parasitic capacitance CDN into the ground voltage potential while the N channel switching transistor N2 is OFF. In addition, the current sources VN1 and the N channel switching transistor N4 form the first current charge preventing circuit for preventing charging of the parasitic capacitance CDP by the voltage potential of the power source while the P channel switching transistor P2 is OFF. Current paths formed by the current sources VP1 and the P channel switching transistor P4 and formed by the power source VN1 and the N channel switching transistors N4 become ON, namely may be used in order to prevent discharging and charging of the parasitic capacitances CDP and CDN while the N channel switching transistor N2 and the P channel switching transistor P2 are OFF, respectively. It is thereby possible to improve the linearity of the oscillation frequency against the control voltage in the voltage controlled oscillator of the second embodiment and it is also possible to maintain stable oscillation of the voltage controlled oscillator.

As described above, according to the voltage controlled oscillator of the second embodiment, it is possible to prevent discharging of the parasitic capacitance CDN and charging of the parasitic capacitance CDP, respectively, by using the power source VP1 or the power source VN1, or by using both the power sources VP1 and VN1 instead of the current source transistors P3 or N3 or both P3 and N3 incorporated in the voltage controlled oscillator as the first embodiment. Therefore the second embodiment obtains the same effect as the first embodiment. Furthermore, by changing the magnitude of the power sources VP1 and VN1 based on various applications it is possible to control the operation of the voltage controlled oscillator as the second embodiment efficiently for desired applications.

Third Embodiment

Figure 8:
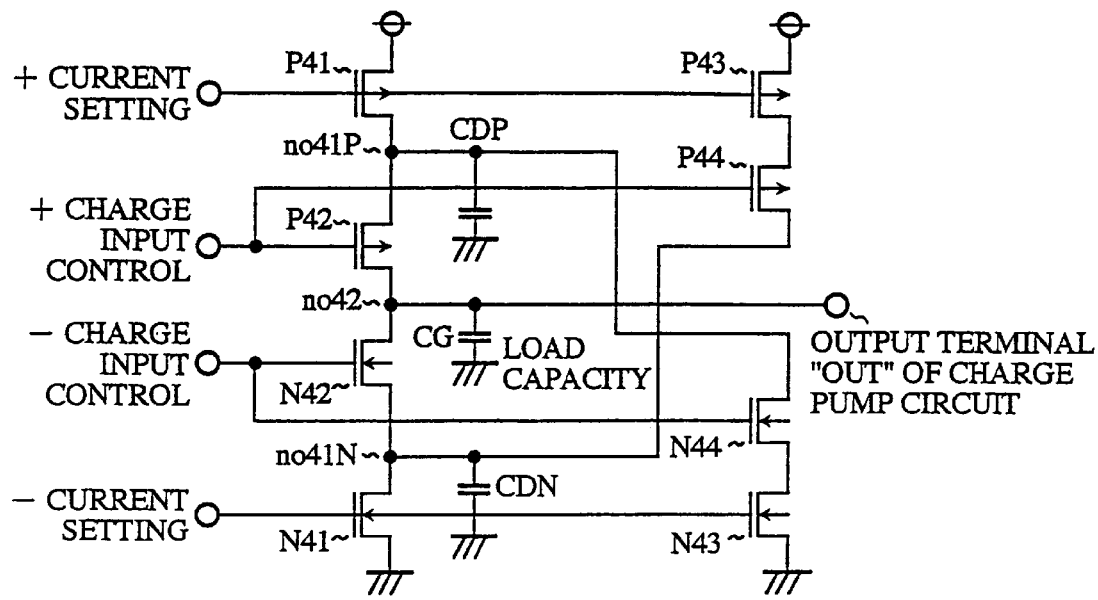
FIG. 8 is a circuit diagram showing a charge pump circuit according to a third embodiment of the present invention.

FIG. 8 is a circuit diagram showing a charge pump circuit according to the third embodiment of the present invention.

In FIG. 8, the reference character P41 designates a current source transistor (a third current source transistor) used for determining an output current according to the voltage supplied to the gate electrode of the current source transistor P41. The reference character N41 denotes a current source transistor (a fourth current source transistor) used for determining an output current according to the voltage supplied to the gate electrode of the current source transistor N41.

The reference character P42 designates a P channel switching transistor (a complementary transistor circuit) for switching the current supplied from the current source transistor P41 by a voltage of the charge input control supplied to the gate electrode of the P channel switching transistor. The reference character N42 designates a N channel switching transistor (a complementary transistor circuit) for switching the current supplied from the current source transistor N41 by a voltage of the charge input control supplied to the gate electrode of the P channel switching transistor. As shown in FIG. 8, the current source transistor P41 is connected in series to the P channel switching transistor P42 to switch the current supplied from the current source transistor P41 through the node no41P. The current source transistor N41 is connected to the N channel switching transistor N42 to switch the current supplied from the current source transistor N41 through the node no41N. The P channel switching transistor P42 is connected to the N channel switching transistor N42 through the node no42.

The reference number P43 designates a current source transistor (a second current discharge preventing circuit), P44 denotes a P channel switching transistor (a second current discharge preventing circuit). This current source transistor P43 and the P channel switching transistor P44 are connected between a high voltage power source and the current source transistor N41 in series.

The reference number N43 designates a current source transistor (a second current charge preventing circuit), N44 denotes a N channel switching transistor (a second current discharge preventing circuit). This current source transistor N43 and the P channel switching transistor N44 are connected between a ground voltage power source and the current source transistor P41 in series.

In order to input a voltage for the charge input control, the gate electrode of the P channel switching transistor P44 and the gate electrode of the N channel switching transistor N44 are connected to the gate electrode of the P channel switching transistor P42 and the gate electrode of the N channel switching transistor N42, respectively.

Next, a description will be given of the operation of the charge pump circuit of the third embodiment.

The current discharge preventing circuit comprising the current source transistor P43 and the P channel switching transistor P44 prevents to discharge the parasite capacitance CDN to the ground voltage power source while the N channel switching transistor N42 is in OFF. Similarly, the current charging preventing circuit comprising the current source transistor N43 and the N channel switching transistor N44 prevents charging of the parasite capacitance CDP by the high voltage power source while the P channel switching transistor P42 is in in OFF.

Next, the difference between the charge pump circuit of the third embodiment shown in FIG. 8 and the conventional charge pump circuit shown in FIG. 3 will be explained.

Figure 1:
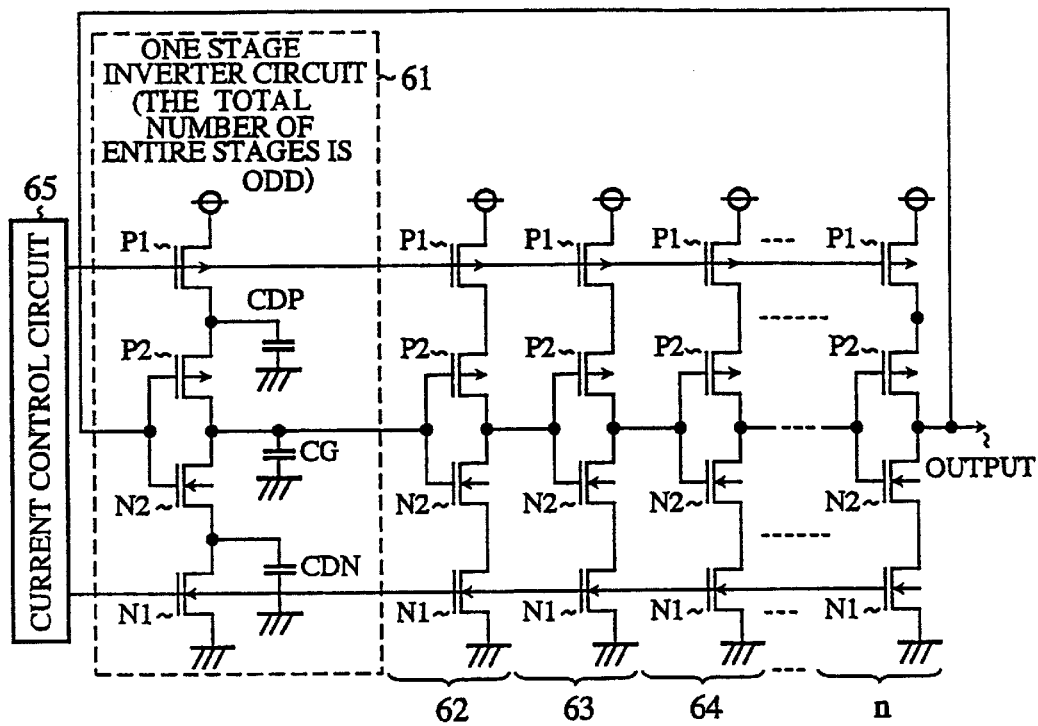
FIG. 1 is a circuit diagram showing the configuration of conventional voltage controlled oscillator.
Figure 2:
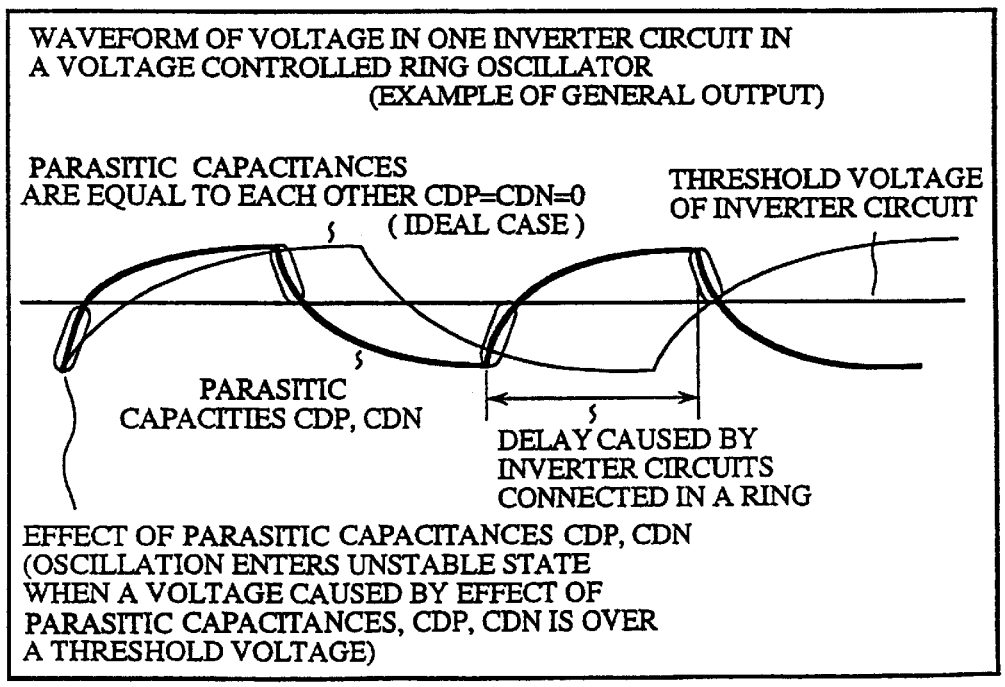
FIG. 2 is a diagram showing the operation of the conventional voltage controlled oscillator shown in FIG. 1.
Figure 3:
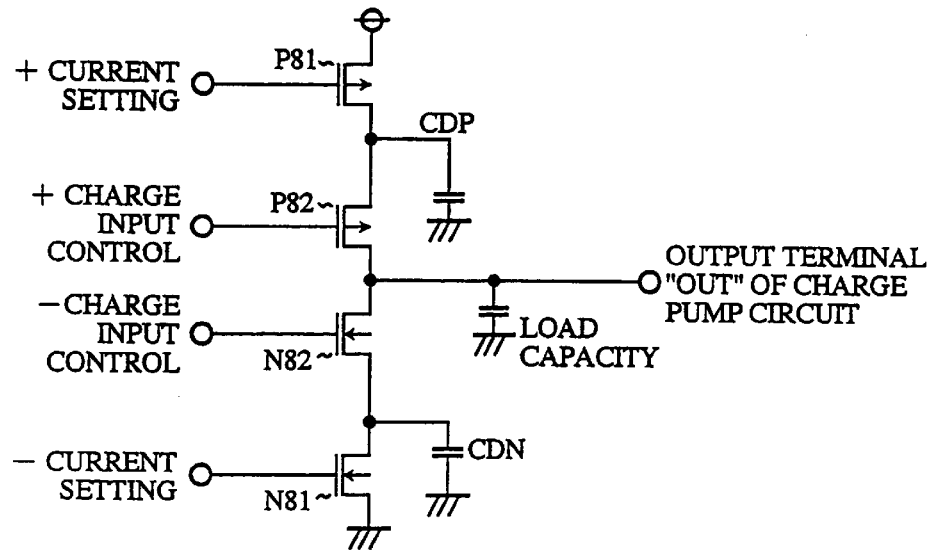
FIG. 3 is a circuit diagram showing a conventional charge pump circuit.

FIG. 3 is a circuit diagram showing a conventional charge pump circuit. In FIG. 3, the reference characters P81 and N81 designate current source transistors by which a value of output current is determined. The reference characters P82 and N82 denote switching transistors to switch this output current. The reference characters CDP and CDN indicate parasitic capacities.

Figure 4:
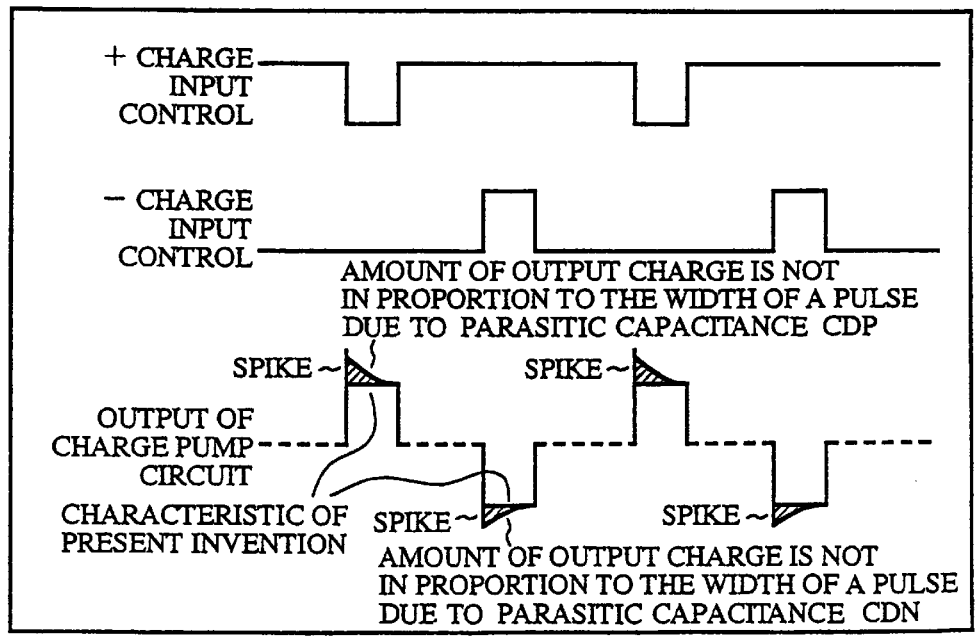
FIG. 4 is a diagram showing the operation of the conventional charge pump circuit shown in FIG. 3.

FIG. 4 is a diagram to compare the operation of the charge pump circuit of the third embodiment with the operation of the conventional charge pump circuit shown in FIG. 3.

As shown in FIG. 4, by the effect of the parasitic capacities CDP and CDN in the conventional charge pump circuit spikes are generated in the output current. Because output offset happens when the balance between those spikes is shifted greatly to each other, the synchronous characteristic becomes bad by these of f sets when the conventional charge pump circuit is used for the phase synchronous circuit. In this case, the spikes are caused by each of the parasitic capacitances CDP and CND that are overlapped with a positive pulse (namely, a source current) output from the current source transistor P41 and with a negative pulse (namely, a sink current) output from the current source transistor N41, respectively. Thus, the effect of the parasitic capacitances causes to decrease the accuracy of the output current as a charge volume.

As described above, according to the third embodiment, each of both the current paths formed by the current source transistor P43 and the P channel switching transistor P44 and formed by the current source transistor N43 and the N channel switching transistor N44 becomes active while each of the N channel switching transistor N42 and the P channel switching transistor P42 is in OFF, respectively, in order to prevent the discharging and the charging of the parasitic capacitances CDN, CDP, and CG. As a result, it is possible to reduce the influence of the charges accumulated in the parasitic capacitances CDN, CDP, and CG at the output terminal OUT of the charge pump circuit, so that it is possible to obtain the effect to output the amount of charges according to a pulse width accurately. Although the charge pump circuit is used in the explanation of the third embodiment described above, the present invention is not limited by this example, for instance, it is possible to apply the present invention to a charge pump circuit incorporated in a synchronous circuit and it is also possible to obtain the same effect.

Fourth Embodiment

Figure 9:
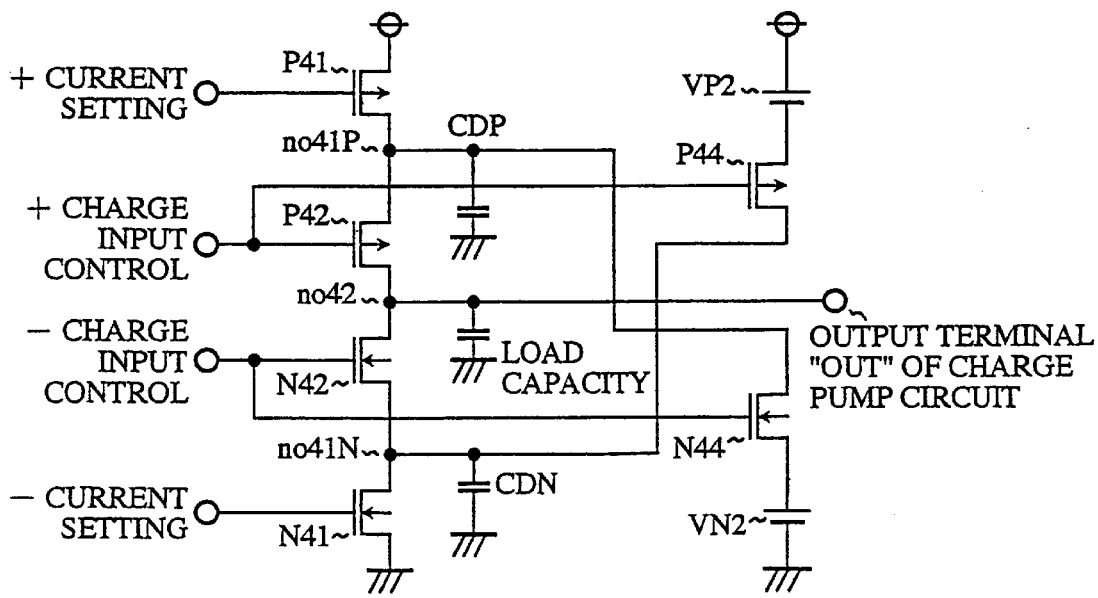
FIG. 9 is a circuit diagram showing a charge pump circuit according to a fourth embodiment of the present invention.

FIG. 9 is a circuit diagram showing a charge pump circuit according to the fourth embodiment of the present invention. In FIG. 9, the reference character VP2 designates a power source (a fifth power source), and P44 denotes a P channel switching transistor. The power source VP2 and the P channel switching transistor P44 are connected to the current source transistor N41 in series. The reference character VN2 designates a power source (a sixth power source), and N44 denotes a N channel switching transistor. The power source VN2 and the N channel switching transistor N44 are connected to the current source transistor P41 in series.

The gate electrode of the P channel switching transistor P44 and the gate electrode of the N channel switching transistor N44 inputting voltages as +/− charge input controls, as shown in FIG. 9, are connected to the gate electrode of the P channel switching transistor P42 and the gate electrode of the N channel switching transistor N42, respectively. Other components of the charge pump circuit as the fourth embodiment are the same as those of the charge pump circuit as the third embodiment shown in FIG. 8, and the same reference numbers and characters are used, and the explanation of those same components is therefore omitted here for brevity.

The charge pump circuit of the fourth embodiment shown in FIG. 9 has another configuration when comparing with the third embodiment shown in FIG. 8. That is, in the fourth embodiment, the power sources VP2 and VN2 are used instead of the current source transistors P43 and N43 of the third embodiment. The charge pump circuit of the fourth embodiment performs the same operation of the charge pump circuit as the third embodiment.

Next, a description will be given of the operation of the charge pump circuit of the fourth embodiment.

The second current discharge preventing circuit comprising the power source VP2 and the P channel switching transistor P44 prevents to discharge the parasite capacitance CDN to the ground voltage power source while the N channel switching transistor N42 is in OFF. Similarly, the second current charge preventing circuit comprising the current source VN2 and the N channel switching transistor N44 prevents to charge the parasite capacitance CDP by the high voltage power source through the current source transistor P41 while the P channel switching transistor P42 is in OFF.

As described above, according to the fourth embodiment, each of the current paths formed by the power source VP2 and the P channel switching transistor P44 and formed by the current source VN2 and the N channel switching transistor N44 become active while each of the N channel switching transistor N42 and the P channel switching transistor P42 is in OFF, respectively, in order to prevent the discharging and the charging of the parasitic capacitances CDN, CDP, and CG. As a result, it is possible to reduce the influence caused by the charges accumulated in the parasitic capacitances CDN, CDP, and CG at the output terminal OUT of the charge pump circuit, so that it is possible to obtain the effect to output the amount of charges according to a pulse width accurately. In addition to this, by changing the value of each of the power sources VP2 and VN2, it is possible to optimize the operation of the charge pump circuit in various application. Although the charge pump circuit is used in the explanation of the fourth embodiment described above, the present invention is not limited by this example, for example, it is possible to apply the present invention to a case in which a charge pump circuit is incorporated in a synchronous circuit and it is also possible to obtain the same effect.

As described above in detail, according to the present invention, a voltage controlled oscillator has a configuration in which a plurality of inverter circuits formed in odd number stages are connected to each other in a ring form, and each inverter circuit comprises a first current discharge preventing circuit and a second current charge preventing circuit. The first current discharge preventing circuit prevents discharging of charges of a parasitic capacity, connected between a high voltage power source and a connection node between a second current source transistor and a complementary transistor circuit. The second current charge preventing circuit prevents charging of charges in a parasitic capacity, connected between said second current source and a connection node between a first current source transistor and the complementary transistor circuit. Therefore, because the first current discharge preventing circuit comprising a current source transistor and a P channel switching transistor prevents discharging of charges of the parasitic capacitance CDN to the voltage of the ground power source while the N channel switching transistor in the complementary transistor circuit is in OFF, and because the first current charge preventing circuit comprising a current source transistor and a N channel switching transistor prevents charging of charges in a parasitic capacitor CDP by the voltage of the power source while the P channel switching transistor in the complementary transistor circuit is in OFF, it is thereby possible to improve the linearity of oscillated frequency to the control voltage supplied from the current control circuit and it is also possible to provide a stable oscillation.

In addition, according to the present invention, because a third power source is used instead of the P channel current switching circuit in the first current discharge preventing circuit and a fourth power source is used instead of the N channel current source transistor, and because change of the values of voltages of those third and fourth power sources may prevent the discharging and charging of charges in the parasitic capacities, there is the effect that it is possible to perform optimum operation of the voltage controlled oscillator for various kinds of applications more efficiently.

According to the present invention, a charge pump circuit has a configuration in which a third current source transistor is connected to a first power source, a fourth current source transistor is connected to a second power source, a complementary transistor circuit is connected between the third current source transistor and the fourth current source transistor, a second current discharge preventing circuit prevents charges in a parasitic capacity, connected between the first current source and a connection node between the fourth current source transistor and the complementary transistor circuit, and a second current charge preventing circuit prevents charges in a parasitic capacity, connected between the second current source and a connection node between the third current source transistor and the complementary transistor circuit. It is therefore possible to prevent charging and discharging of charges in the parasitic capacitances CDN, CDP, and CG. As a result, it is possible to decrease the bad influence, caused by the charges accumulated in the parasitic capacities, at the output terminal of the charge pump circuit. Further, there is the effect that the charge pump circuit of the present invention may be applied to increase the accuracy of the charge pump circuit used in various phase synchronous circuits.

Moreover, according to the present invention, because a fifth power source is used instead of the P channel current source transistor in the second current discharge preventing circuit and a sixth power source is used instead of the N channel current source transistor, and because the control of the voltage of each of the parasitic capacitances performed by using the voltage of the fifth power source and by using the voltage of the sixth power source may prevent the discharging and charging of charges in the parasitic capacities, it is therefore possible to perform optimum operation of the charge pump circuit efficiently by changing the voltage of each of the fifth power source and the sixth power source in various application. In addition, the configuration of the above charge pump circuit may be applied to phase synchronous circuits in order to increase the accuracy of charge pump circuits incorporated in those phase synchronous circuits. In those cases, it is also possible to obtain the same effect.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A voltage controlled oscillator comprising:
   an odd number of inverter circuits connected in a ring; and
   a current control circuit for generating and outputting a control voltage supplied to said inverter circuits, wherein each of said inverter circuits comprises:
   a first current source transistor connected to a first power source;
   a second current source transistor connected to a second power source;
   a complementary transistor circuit connected between said first current source transistor and said second current source transistor;
   a current discharge preventing circuit for preventing discharging of electrical charge accumulated in a parasitic capacitance, said current discharge preventing circuit being connected between said first power source and a connection node of said second current source transistor and said complementary transistor circuit; and
   a current charge preventing circuit for preventing charging of a parasitic capacitance, said current charge preventing circuit being connected between said second power source and a connection node of said first current source transistor and said complementary transistor circuit, wherein said current control circuit outputs the control voltage to said first current source transistor and said second current source transistor in each of said inverter circuits.

2. The voltage controlled oscillator as claimed in claim 1, wherein said complementary transistor circuit comprises a P channel switching transistor and an N channel switching transistor connected in series, said current discharge preventing circuit comprises a P channel current source transistor and a P channel switching transistor connected in series, and said current charge preventing circuit comprises an N channel current source transistor and an N channel switching transistor connected in series.

3. A charge pump circuit comprising:
   a first current source transistor connected to a first power source;
   a second current source transistor connected to a second power source;
   a complementary transistor circuit connected between said first current source transistor and said second current source transistor;
   a current discharge preventing circuit for preventing discharging of electrical charge accumulated in a parasitic capacitance, said current discharge preventing circuit being connected between said first power source and a connection node of said second current source transistor and said complementary transistor circuit; and
   a current charge preventing circuit for preventing charging of a parasitic capacitance, said current charge preventing circuit being connected between said second power source and a connection node of said first current source transistor and said complementary transistor circuit.

4. The charge pump circuit as claimed in claim 3, wherein said complementary transistor circuit comprises a P channel switching transistor and an N channel switching transistor connected in series, said current discharge preventing circuit comprises a P channel current source transistor and a P channel switching transistor connected in series, said current charge preventing circuit comprises an N channel current source transistor and an N channel switching transistor connected in series, a gate electrode of said P channel switching transistor in said complementary transistor circuit is connected to a gate electrode of said P channel switching transistor in said current discharge preventing circuit, and a gate electrode of said N channel switching transistor in said complementary transistor circuit is connected to a gate electrode of said N channel switching transistor in said current charge preventing circuit.

5. The voltage controlled oscillator as claimed in claim 1, wherein said complementary transistor circuit comprises a P channel switching transistor and an N channel switching transistor connected in series, said current discharge preventing circuit comprises a third power source and a P channel switching transistor connected in series, said current charge preventing circuit comprises a fourth power source and an N channel switching transistor connected in series, and voltages across parasitic capacitances are controlled by said third and fourth power sources to prevent discharging and charging.

6. The charge pump circuit as claimed in claim 3, wherein said complementary transistor circuit comprises a P channel switching transistor and an N channel switching transistor connected in series, said current discharge preventing circuit comprises a third power source and a P channel switching transistor connected in series, said current charge preventing circuit comprises a fourth power source and an N channel switching transistor connected in series, a gate electrode of said P channel switching transistor in said complementary transistor circuit is connected to a gate electrode of said P channel switching transistor in said current discharge preventing circuit, a gate electrode of said N channel switching transistor in said complementary transistor circuit is connected to a gate electrode of said N channel switching transistor in said current charge preventing circuit, and voltages across parasitic capacitances are controlled by said third and fourth power sources to prevent discharging and charging.

\* \* \* \* \*